US006978068B2

(12) United States Patent
Wilson et al.

(10) Patent No.: US 6,978,068 B2
(45) Date of Patent: Dec. 20, 2005

(54) SNAP-FIT OPTICAL ELEMENT FOR OPTICAL COUPLING BETWEEN A LIGHT SOURCE AND TARGET ELEMENT USING SURFACE MOUNT TECHNOLOGY

(75) Inventors: Robert E. Wilson, Palo Alto, CA (US); Brenton A. Baugh, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 36 days.

(21) Appl. No.: 10/841,896

(22) Filed: May 6, 2004

(65) Prior Publication Data

US 2005/0249463 A1 Nov. 10, 2005

(51) Int. Cl.[7] .......................... G02B 6/32; G02B 6/26; G02B 6/42; H01I 23/52

(52) U.S. Cl. .......................... 385/52; 385/33; 385/93; 257/738; 257/779

(58) Field of Search .......................... 385/33, 52, 92, 385/93; 257/737, 738, 778, 779

(56) References Cited

U.S. PATENT DOCUMENTS 5,877,560 A * 3/1999 Wen et al. .................. 257/778
6,533,391 B1 * 3/2003 Pan .......................... 347/42

* cited by examiner

*Primary Examiner*—John D. Lee
*Assistant Examiner*—Tina M. Wong

(57) ABSTRACT

An optical subassembly includes a substrate, a group of solder features on the substrate, a die on the substrate, and a cap on the substrate and over the die. The cap includes (1) a lens over the die and (2) an inner or outer surface that snap-fits to the solder features.

20 Claims, 5 Drawing Sheets

SNAP-FIT OPTICAL ELEMENT FOR OPTICAL COUPLING BETWEEN A LIGHT SOURCE AND TARGET ELEMENT USING SURFACE MOUNT TECHNOLOGY

DESCRIPTION OF RELATED ART

Conventional fiber optic modules require highly precise alignment between the light source (e.g., a laser or LED on the transmitter side or a fiber on the receiver side), the lens, and the target (e.g., a fiber on the transmitter side or a photodiode on the receiver side). In general, this alignment is achieved "actively," meaning that the optical link is powered and the coupling between the light source and the target is monitored while moving some portion of the system. At the location of maximum coupled power, the solution is mechanically locked in place. This process is slow and costly, requiring not only a set of precision mechanical movers but also opto-electronic test equipment to power and monitor the system.

SUMMARY

In one embodiment of the invention, an optical subassembly includes a substrate, a group of solder feature on the substrate, a die on the substrate, and a cap on the substrate and over the die. The cap includes (1) a lens over the die and (2) an inner or outer surface that snap-fits to the solder features.

BRIEF DESCRIPTION OF THE DRAWINGS

Use of the same reference numbers in different figures indicates similar or identical elements.

DETAILED DESCRIPTION

A snap-fit optical element allows the elimination of expensive equipment and the slow process time that constrain manufacturers today. This opens the door to manufacturing the product at less sophisticated locations to reduce the manufacturing costs.

Figure 1:
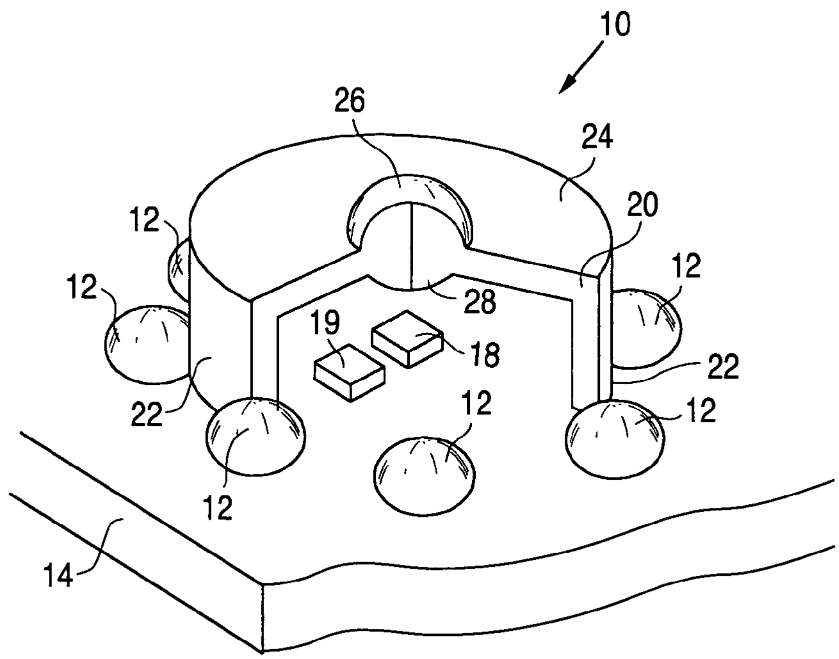
FIG. 1 is a perspective cut-away view of an optical subassembly in one embodiment of the invention.
Figure 2:
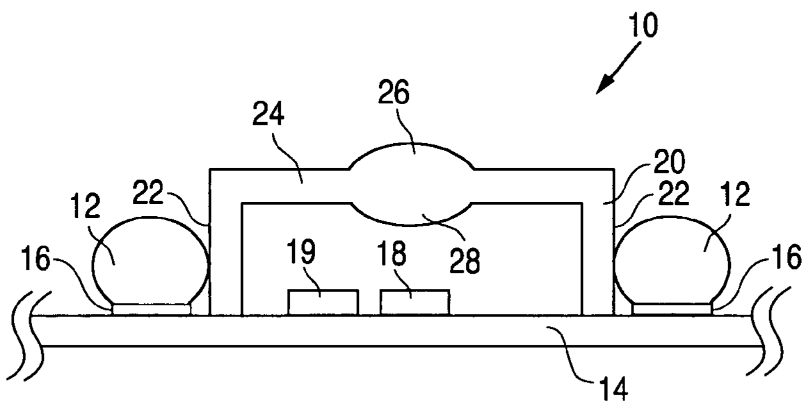
FIG. 2 is a cross-sectional view of the optical subassembly of FIG. 1 in one embodiment of the invention.
Figure 3:
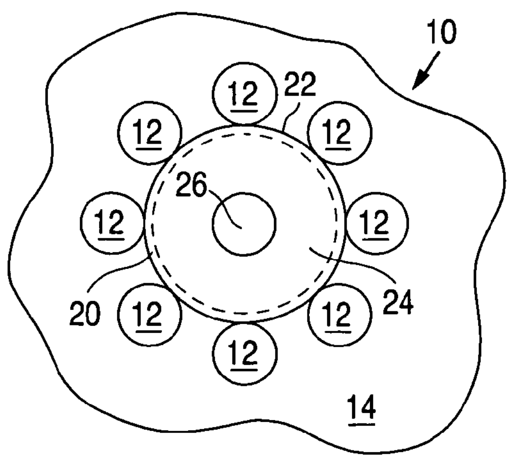
FIG. 3 is a top view of the optical subassembly of FIG. 1 in one embodiment of the invention.

FIGS. 1, 2, and 3 illustrate an optical subassembly 10 in one embodiment of the invention. Optical subassembly 10 includes a group of solder fiducial features 12 (e.g., a ring of solder balls) formed on a substrate 14. The ring of solder balls 12 forms a female snap-fit feature for receiving a male snap-fit feature. Solder balls 12 can be deposited or screen printed atop circular solder pads 16 (FIG. 2) on substrate 14. In one embodiment, solder pads 16 are generally circular and solder balls 12 are generally spherical. Nonetheless, the concepts disclosed herein are applicable to solder pads and solder fiducial features consisting of other repeatable shapes. Substrate 14 can be a printed circuit board (PCB), a flexible circuit, a ceramic substrate, or a silicon substrate.

A die 18 is mounted at the center of the ring of solder balls 12. Die 18 can be an optical device such as a laser, a light emitting diode, a transmitter, a photodiode, a receiver, or a transceiver. A die 19 can also be mounted within the ring of solder balls 12. Die 19 can be driver integrated circuit (IC), a post-amplification IC, or any other IC that works with die 18. Dies 18 and 19 can be electrically connected by wire bonds or traces in substrate 14.

A lens cap 20 is mounted on substrate 14 over die 18. Lens cap 20 can be made of a high temperature optical material such as Ultem® from General Electric Plastics or other suitable optical material. In one embodiment, lens cap 20 is a hollow cylinder with a base 24 and an outer cylindrical surface 22. Base 24 include a lens 26 (e.g., a collimating lens) on the top base surface and/or a lens 28 (e.g., a converging lens) on the bottom base surface. Outer cylindrical surface 22 forms a male snap-fit feature that is received by the female snap-fit feature formed by the ring of solder balls 12. The snap-fit features retain lens cap 20 on substrate 14 and aligns lens 26/28 to die 18. Lens cap 20 can be an injection molded piece with a deformable outer surface 22 that forms a tight fit with deformable solder balls 12.

One advantage of optical subassembly 10 is the ability to accurately locate solder balls 12 due to its inherent tight tolerance to solder pads 16, which are quite accurate since they are conventional photolithographically defined features. While a single solder ball 12 may be susceptible to small variations (e.g., ball volume, surface tension, reflow condition, and oxide level), the geometric center of solder ball 12 is nonetheless located close to the geometric center of solder pad 16. Typically, the tolerance of PCB pad center to pad center over about a 5 mm distance is about $\pm 5\ \mu m$, the tolerance of solder ball radius for a $300\ \mu m$ diameter balls is about $\pm 5\ \mu m$, the tolerance of solder ball center to pad center alignment is about $\pm 1\ \mu m$. In the worst case, the overall alignment may be off by $\pm 11\ \mu m$. Assuming a normal distribution of all three tolerances, a root-mean-square analysis gives an overall tolerance of $\pm 7\ \mu m$. Furthermore, if multiple solder balls 12 are used as the alignment reference, the variations between solder balls and solder pads can be averaged out to provide an ever higher degree of accuracy.

Figure 4:
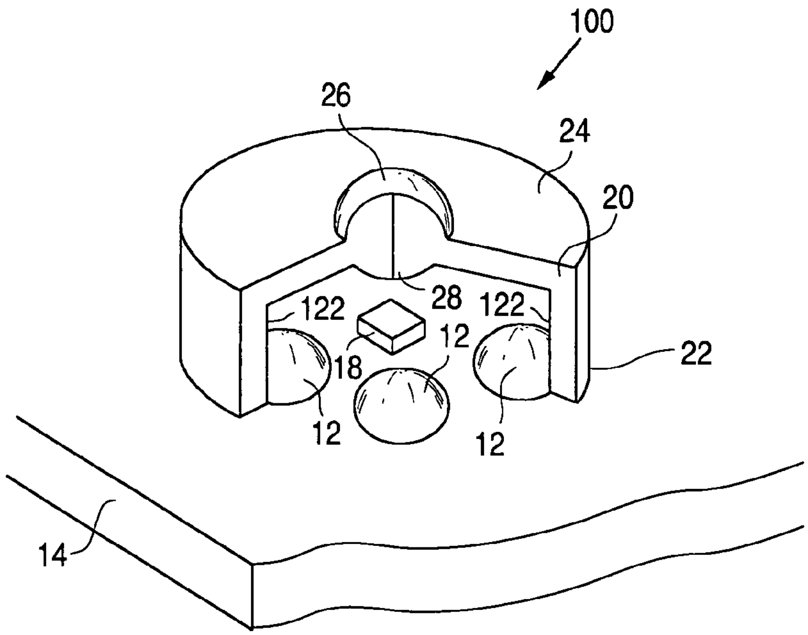
FIG. 4 is a perspective cut-away view of an optical subassembly in one embodiment of the invention.
Figure 5:
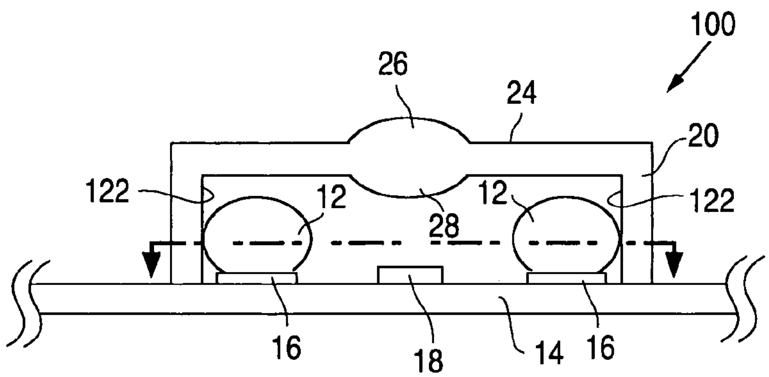
FIG. 5 is a cross-sectional view of the optical subassembly of FIG. 1 in one embodiment of the invention.
Figure 6:
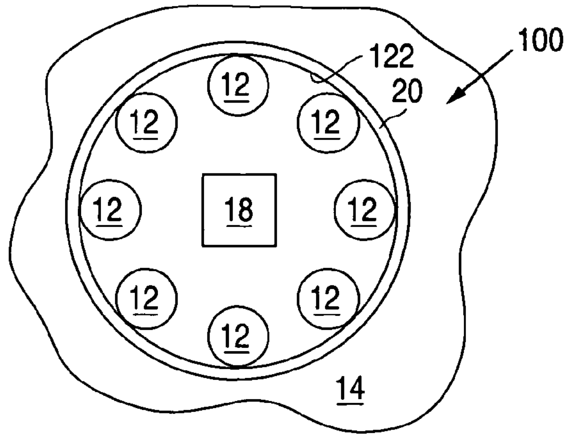
FIG. 6 is a top cross-sectional view of the optical subassembly of FIG. 1 in one embodiment of the invention.

FIGS. 4, 5, and 6 illustrate an optical subassembly 100 in one embodiment of the invention. Optical subassembly 100 is similar to optical subassembly 10 except that an inner cylindrical surface 122 of lens cap 20 forms a female snap-fit feature while the ring of solder balls 12 form a male snap-fit feature. Thus, inner cylindrical surface 122 fits around the ring of solder balls 12 to create the snap-fit.

Figure 7:
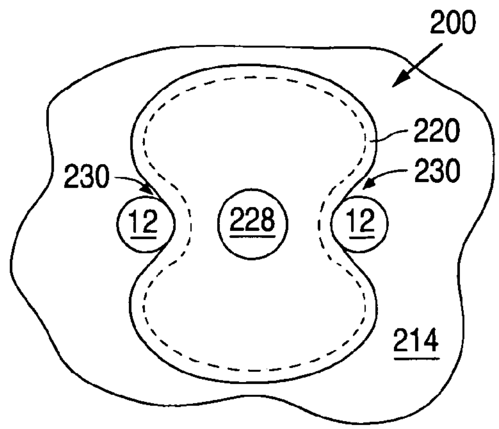
FIG. 7 is a top view of an optical subassembly in one embodiment of the invention.

Although cylindrical snap-fit features formed by the solder balls and the lens cap have been illustrated above, other shapes can be utilized. FIG. 7 illustrates an optical subassembly 200 in one embodiment of the invention. A lens cap 220 has notches 230 that form a snap-fit feature for receiving another snap-fit feature formed by two solder balls 12 on substrate 214. Here, only two solder balls 12 are necessary to mount and align lens cap 220. Lens cap 220 further includes one or more lens 228 located over a die on substrate 214.

Figure 8:
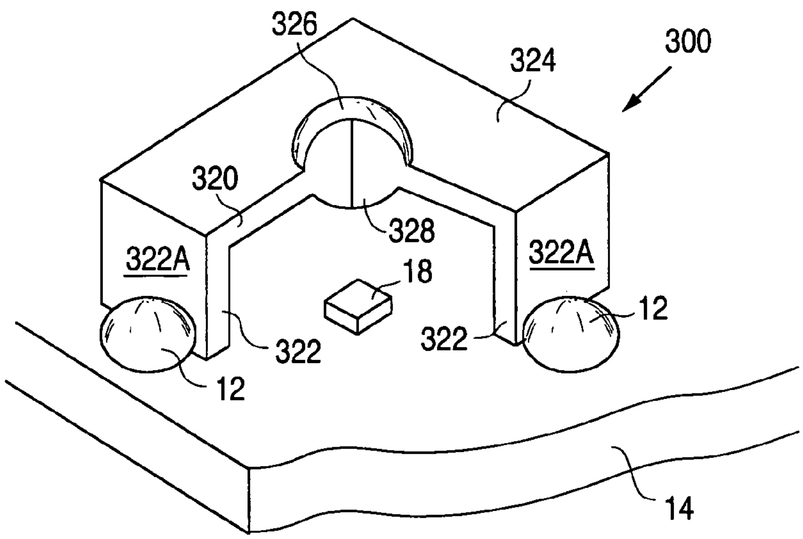
FIG. 8 is a perspective cut-away view of another optical subassembly in one embodiment of the invention.

FIG. 8 illustrates an optical subassembly 300 in one embodiment of the invention. Optical subassembly 300 uses a rectangular lens cap 320 having a base 324 and orthogonal sidewalls 322. Base 324 include a lens 326 (e.g., a collimating lens) on the top base surface and/or a lens 328 (e.g., a converging lens) on the bottom base surface. The outer sidewall surfaces 322A form a male snap-fit feature that is received by a female snap-fit feature formed by solder balls 12. The snap-fit features retain lens cap 320 on substrate 14 and aligns lens 326/328 to die 18.

Figure 9:
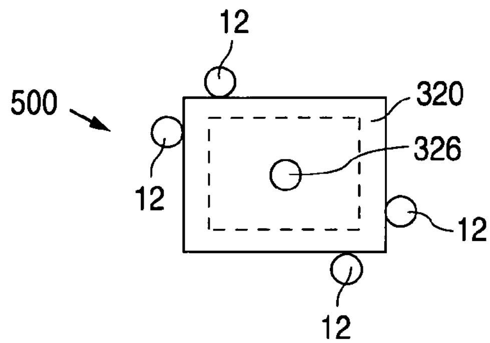
FIG. 9 is a perspective cut-away view of another optical subassembly in one embodiment of the invention.

FIG. 9 illustrates an optical subassembly 500 in one embodiment of the invention. Subassembly 500 is similar to subassembly 300 except that two opposing outer corners of rectangular lens cap 320 are sandwiched between two opposing pairs of solder balls 12.

Figure 10:
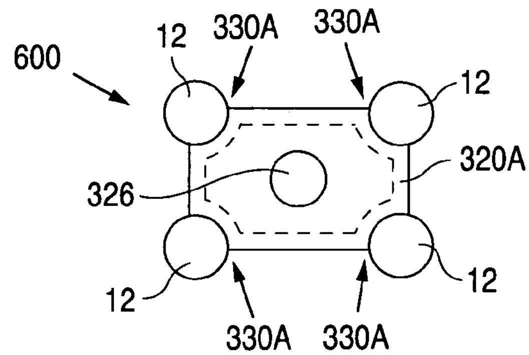

FIG. 10 illustrates an optical subassembly 600 in one embodiment of the invention. Subassembly 600 is similar to subassembly 300 except that rectangular lens cap 320A has notches 330A formed at its four corners to fit against four solder balls 12.

Figure 11:
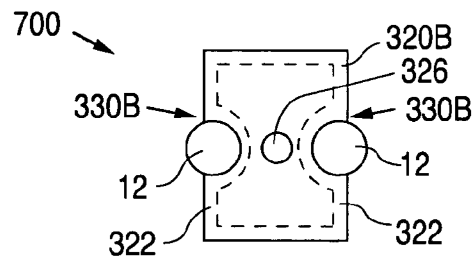

FIG. 11 illustrates an optical subassembly 700 in one embodiment of the invention. Subassembly 700 is similar to subassembly 300 except that lens cap 320B has two opposing sidewalls 322 with notches 330 to fit against solder balls 12.

Figure 12:
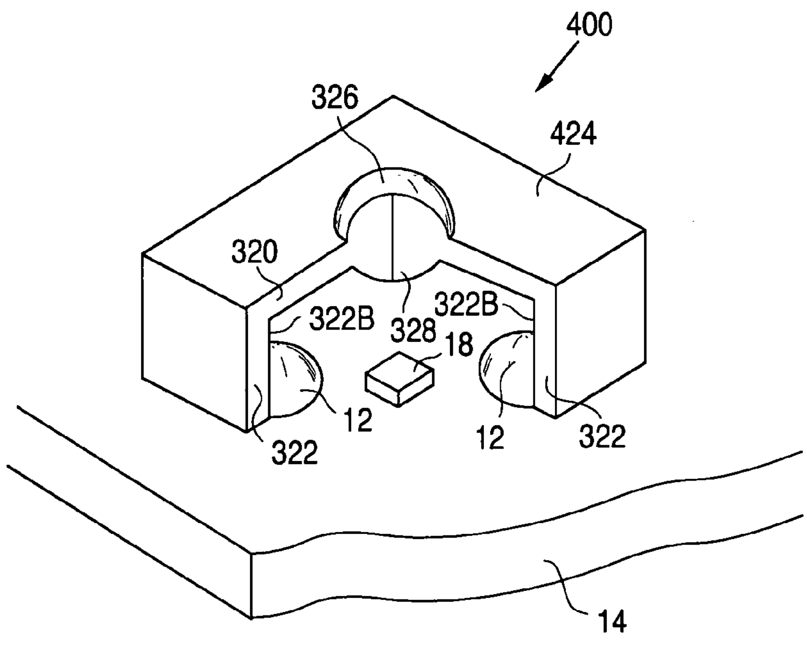
FIGS. 10, 11, 12, 13, 14 are top cross-sectional views of optical subassemblies in embodiments of the invention.

FIG. 12 illustrates an optical subassembly 400 in one embodiment of the invention. Subassembly 400 is similar to subassembly 300 except that inner sidewalls surfaces 322B form a female snap-fit feature that receives a male snap-fit feature formed by solder balls 12.

Figure 13:
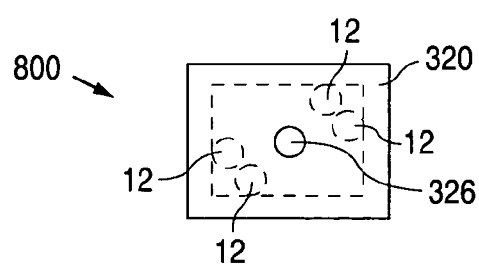

FIG. 13 illustrates an optical subassembly 800 in one embodiment of the invention. Subassembly 800 is similar to subassembly 400 except that two opposing pairs of solder balls 12 are located to fit against two opposing inside corners of rectangular lens cap 320.

Figure 14:
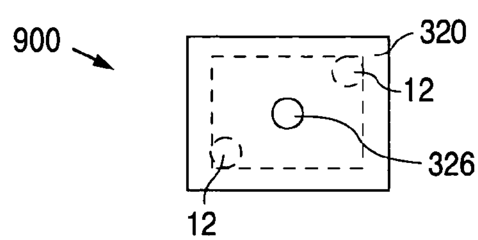

FIG. 14 illustrates an optical subassembly 900 in one embodiment of the invention. Subassembly 900 is similar to subassembly 400 except that two opposing solder balls 12 are located to fit against two opposing inside corners of rectangular lens cap 320.

Figure 15:
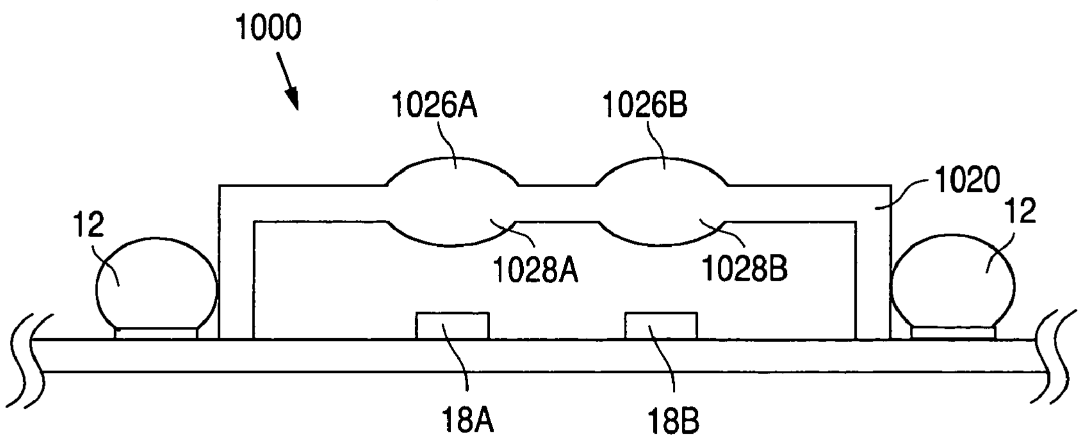
FIGS. 15 and 16 are side and top cross-sectional views of another optical assembly in one embodiment of the invention.
Figure 16:
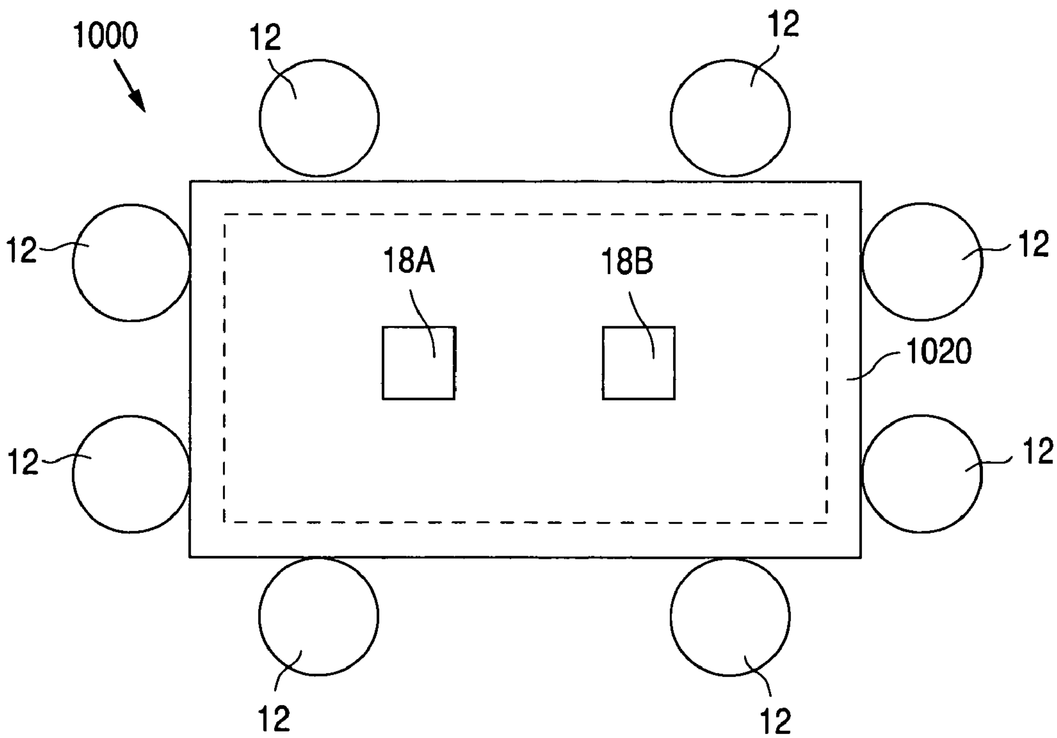

FIGS. 15 and 16 illustrate an optical assembly 1000 in one embodiment of the invention. Subassembly 1000 is similar to subassembly 500 except that lens cap 1020 includes lenses 1026A and 1028B for a die 18A, and lenses 1026B and 1028B for a die 18B. This shows that any of the embodiments described above may multiple dies having corresponding lenses.

Various other adaptations and combinations of features of the embodiments disclosed are within the scope of the invention. Numerous embodiments are encompassed by the following claims.

What is claimed is:

1. An optical subassembly, comprising:

a substrate;

a plurality of solder features on the substrate, the solder features defining a first snap-fit feature;

a die on the substrate, the die comprising an optical device; and a cap on the substrate and over the die, the cap comprising (1) a lens over the die and (2) a surface defining a second snap-fit feature that mates with the first snap-fit feature to retain the cap on the substrate and to align the lens to the die.

2. The subassembly of claim 1, wherein the solder features comprises solder balls.

3. The subassembly of claim 2, wherein the cap comprises a hollow cylinder.

4. The subassembly of claim 1, wherein the surface is selected form the group consisting of (1) an outer surface that fits inside the solder features and (2) an inner surface that receives the solder features.

5. The subassembly of claim 1, wherein the cap comprises a base and the lens is on the base.

6. The subassembly of claim 1, wherein:

the substrate is selected from the group consisting of a printed circuit board, a flexible circuit, a ceramic substrate, and a silicon substrate; and the optical device is selected from the group consisting of a laser, a light emitting diode, a transmitter, a photodiode, a receiver, and a transceiver.

7. The subassembly of claim 1, wherein the cap is rectangular and the solder features comprises two opposing pairs of solder balls that fit against two opposing inner or outer corners of the cap.

8. The subassembly of claim 1, wherein the cap is rectangular with notched corners and the solder features comprises four solder balls that fit against the notched corners.

9. The subassembly of claim 1, wherein the cap is rectangular with two opposing sidewalls defining two notches and the solder feature comprises two solder balls that fit against the notches.

10. The subassembly of claim 1, wherein the cap is rectangular and the solder features comprises two opposing solder balls that fit against two opposing inner corners of the cap.

11. A method for assembly an optical subassembly, comprising:

forming solder features on a substrate, the solder features defining a first snap-fit feature;

mounting a die on the substrate, the die comprising an optical device; and mounting a cap on the substrate and over the die, the cap comprising (1) a lens over the die and (2) a surface defining a second snap-fit feature that mates with the first snap-fit feature to retain the cap on the substrate.

12. The method of claim 11, wherein said forming solder features comprises forming solder balls.

13. The method of claim 12, wherein the cap comprises a hollow cylinder.

14. The method of claim 11, wherein the surface is selected from the group consisting of (1) an outer surface and said mounting a cap comprises fitting the outer surface inside the solder features and (2) an inner surface and said mounting a cap comprises fitting the inner surface around the solder features.

15. The method of claim 11, wherein the cap comprises a base and the lens is on the base.

16. The method of claim 11, wherein:

the substrate is selected from the group consisting of a printed circuit board, a flexible circuit, a ceramic substrate, and a silicon substrate; and the optical device is selected from the group consisting of a laser, a light emitting diode, a transmitter, a photodiode, a receiver, and a transceiver.

17. The method of claim 11, wherein the cap is rectangular and the solder features comprises two opposing pairs of solder balls that fit against two opposing inner or outer corners of the cap.

18. The method of claim 11, wherein the cap is rectangular with notched corners and the solder features comprises four solder balls that fit against the notched corners.

19. The method of claim 11, wherein the cap is rectangular with two opposing sidewalls defining two notches and the solder feature comprises two solder balls that fit against the notches.

20. The method of claim 11, wherein the cap is rectangular and the solder features comprises two opposing solder balls that fit against two opposing inner corners of the cap.

* * * * *